United States Patent
Cheng et al.

(10) Patent No.: US 6,806,142 B1
(45) Date of Patent: Oct. 19, 2004

(54) METHOD FOR CODING SEMICONDUCTOR PERMANENT STORE ROM

(75) Inventors: An-Ru Cheng, Valencia, CA (US); Kwo-Jen Liu, San Jose, CA (US); Chih-Hung Chen, Hsin-Chu (TW)

(73) Assignee: Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 10/604,263

(22) Filed: Jul. 7, 2003

(51) Int. Cl.[7] .......................................... H01L 21/8234
(52) U.S. Cl. ..................................... 438/275; 438/278
(58) Field of Search ............................... 438/357, 275, 438/278

(56) References Cited

U.S. PATENT DOCUMENTS 6,190,974 B1 * 2/2001 Wang .......................... 438/276
6,251,732 B1 * 6/2001 Hsu ............................. 438/276
6,621,129 B1 * 9/2003 Lin et al. ..................... 257/390

* cited by examiner

Primary Examiner—David Nelms
Assistant Examiner—Thao P. Le
(74) Attorney, Agent, or Firm—Winston Hsu

(57) ABSTRACT

A method for manufacturing a ROM device includes a semiconductor substrate having an array of field-effect transistors within a ROM region. A first dielectric layer covers the array and all transistors are initially in an "ON" state. A second dielectric layer covers at least one layer of metal interconnection formed over the first dielectric layer. The bit lines do not overlap the transistor-sources. A coding photoresist layer is formed on the second dielectric layer and is patterned to form a plurality of apertures defining exposure windows exposing underlying field-effect transistors to be coded permanently to an "OFF" state. A code etching back process is implemented using the photoresist layer as a mask to etch the first and second dielectric layers, the sources of the MOSFETs, and a portion of the substrate through the exposure windows to form a deep trench, disconnecting the coded MOSFETs from the source lines.

8 Claims, 17 Drawing Sheets

METHOD FOR CODING SEMICONDUCTOR PERMANENT STORE ROM

BACKGROUND OF INVENTION

1. Field of the Invention

The present invention relates generally to a method for manufacturing read only memory (ROM) devices. More specifically, a method is disclosed for shortening the product turn-around time for making semiconductor permanent store ROM by ROM coding the memory in a late stage. Instead of threshold voltage implantation, the present invention uses deep trench etching to implement ROM cell coding.

2. Description of the Prior Art

Read-only memory (ROM), also known as firmware, is an integrated circuit programmed with specific data when it is manufactured. ROM chips are used not only in computers, but in most other electronic items as well. The process of programming data is also referred to as coding. Hitherto, numerous coding methods have been developed to program data into the memory cells during different phases of their manufacture. One development that has gained wide use is the threshold voltage implant method, which changes a transistor's threshold voltage by ion implanting the transistor gates for programmed cells. By way of example, for coding an N-channel memory cell, a predetermined dosage of impurities such as boron are implanted into the channel area under the gate of the transistor to raise its threshold voltage, thereby turning this memory cell into an "off" state. Another coding method includes selectively opening the contact holes for each transistor to drain. Such method, which is also known as the through-hole contact programming technique, requires a contact for every cell, thereby increasing the size of the cell array.

It is often desirable to apply the ROM code onto the partially completed devices during a latter part of the manufacturing process. By applying the code at the latter part of the process, it takes less time to complete wafer processing. Customers require the product turn-around time between reception of the ROM code for a custom order and delivery of finished parts to be kept as short as possible. Less time for completion means a shorter product turn-around time.

U.S. Pat. No. 4,268,950, filed Jun. 5, 1978 by Chatterjee et al., assigned to Texas Instruments discloses a process for making an N-channel silicon gate MOS read only memory that may be programmed -at a late stage in the manufacturing process. The cell array is programmed by boron implantation through a protective nitride, polysilicon strips, and gate oxides to raise the threshold voltage of selected cells to a value above that which will be turned on by the voltage on the selected address line. U.S. Pat. No. 5,514,609, filed May 13, 1994 by Chen et al., assigned to Mosel Vitelic discloses the manufacture of a ROM cell that is coded before metallization. ROM code impurities are implanted first through a dielectric layer overlying gate electrodes, and then through the underlying selected gate electrodes.

U.S. Pat. No. 6,020,241, filed Dec. 22, 1997 by You et al., assigned to Taiwan Semiconductor Manufacturing Company discloses a method of manufacturing a ROM that is code implanted late in the process after the first level metal thus reducing the turn-around time to ship a customer order. The code implantation implants impurities through a first dielectric layer overlying gates and a second dielectric layer overlying the first dielectric layer, and through a portion of the word lines.

SUMMARY OF INVENTION

It is therefore a primary objective of this invention to provide a method for manufacturing high-density read only memory (ROM) devices, thereby shortening the product turn-around time.

Briefly summarized, the preferred embodiment of the present invention discloses a method for manufacturing a read only memory (ROM) device capable of shortening product turn-around time. A semiconductor substrate having thereon an array of metal-oxide-semiconductor field-effect transistors (MOSFETS) within a ROM region is provided. A dielectric layer covers the MOSFETs within the ROM region. Each of the MOSFETs has a gate, a source, and a drain. All of the MOSFETs are initially in an "ON" state. The method comprises forming a coding photoresist layer on the dielectric layer. The coding photoresist layer is then patterned to form a plurality of apertures defining exposure windows where the underlying MOSFETs are to be coded from the "ON" state into an "OFF" state. The exposure windows are disposed above the sources of the MOSFETs to be coded. An etching process is carried out, using the patterning coding photoresist layer as an etching hard mask, to etch the dielectric layer, the sources of the MOSFETs to be coded, and a portion of the semiconductor substrate underneath the sources of the MOSFETs to be coded through the exposure windows to a depth that is lower than a junction depth of the sources of the MOSFETs to be coded, to form a deep trench that disconnects the sources of the MOSFETs to be coded from source lines. The coding photoresist layer is stripped. A gap fill layer is deposited over the dielectric layer to fill the deep trench.

According to the claimed invention, a method for manufacturing a read only memory (ROM) device is disclosed. A semiconductor substrate having thereon an array of field-effect transistors within a ROM region and a first dielectric layer covering the array of field-effect transistors is provided. Each of the MOSFETs. has a gate, a drain, and a source connected to a source line. All of the field-effect transistors are initially in an "ON" state. The method comprises forming bit lines on the first dielectric layer within the ROM region. The bit lines are covered by a second dielectric layer. The bit lines bypass the underlying sources of the array of the field-effect transistors to not overlap with the sources. A coding photoresist layer is formed on the second dielectric layer. The coding photoresist layer is then patterned to form a plurality of apertures defining exposure windows where the underlying field-effect transistors are to be coded permanently to an "OFF" state. A code etching back process is implemented using the patterning coding photoresist layer as an etching hard mask to etch the second dielectric layer, the first dielectric layer, the sources of the MOSFETs to be coded, and a portion of the semiconductor substrate underneath the sources of the MOSFETs to be coded through the exposure windows to a depth that is lower than a junction depth of the sources of the MOSFETs to be coded, so as to form a deep trench, which disconnects the sources of the MOSFETs to be coded from the source lines. The coding photoresist layer is stripped. A gap fill layer is thereafter deposited over the dielectric layer to fill the deep trench. Other objects, advantages, and novel features of the claimed invention will become more clearly and readily apparent from the following detailed description when taken in conjunction with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

The preferred embodiment in accordance with the present invention will be discussed in detail with reference to FIG. 1 to FIG. 17. It is understood that the type of semiconductor regions, device layout, and polarity of voltages are chosen solely for illustration, and persons having ordinary skill in the art would recognize other alternatives, variations, and modifications.

Figure 1:
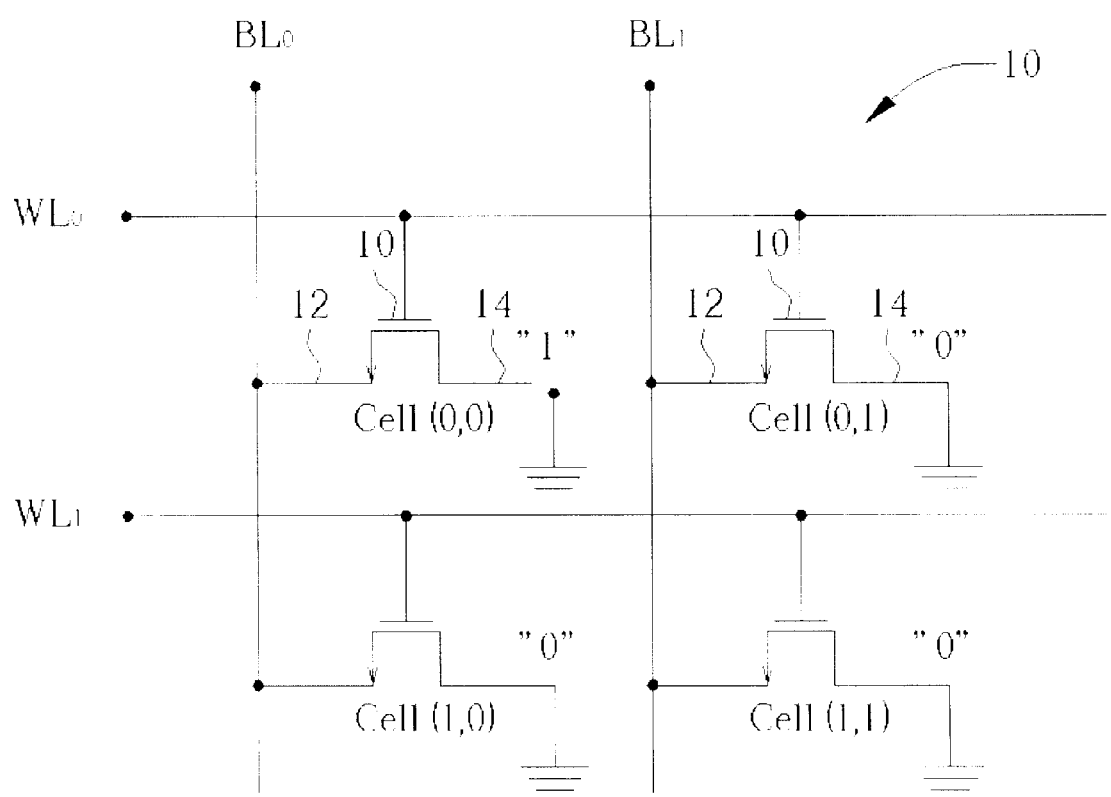
FIG. 1 illustrates a portion of a ROM array, which is programmed according to this invention.

Please refer to FIG. 1. FIG. 1 illustrates a portion of a ROM array, which is programmed according to this invention. The ROM array consists of a large number of memory cells, only four of which are shown for simplicity. As shown in FIG. 1, the exemplary four memory cells are cell (0,0), cell (0,1), cell (1,0), and cell (1,1). Each cell is a MOS transistor having a gate 10, a drain 12, and a source 14. The gates 10 are parts of word lines $WL_0$, $WL_1$, which are the X address lines for the array. The drains 12, which are $N^+$ diffusion regions, are electrically connected to bit lines (or Y output lines) $BL_0$, $BL_1$. The sources 14 are $N^+$ diffusion regions, which are defined along with the drains 12. According to the present invention, the specific binary code is programmed into the ROM array through a source-side code mask and an etching back process. As indicated, the source 14 of the cell (0,0) is disconnected from the corresponding source line to store logic data "1". The other cells storing logic data "0" have the sources 14 electrically connected to the source lines (not shown) that are grounded or biased to Vss.

Figure 2:
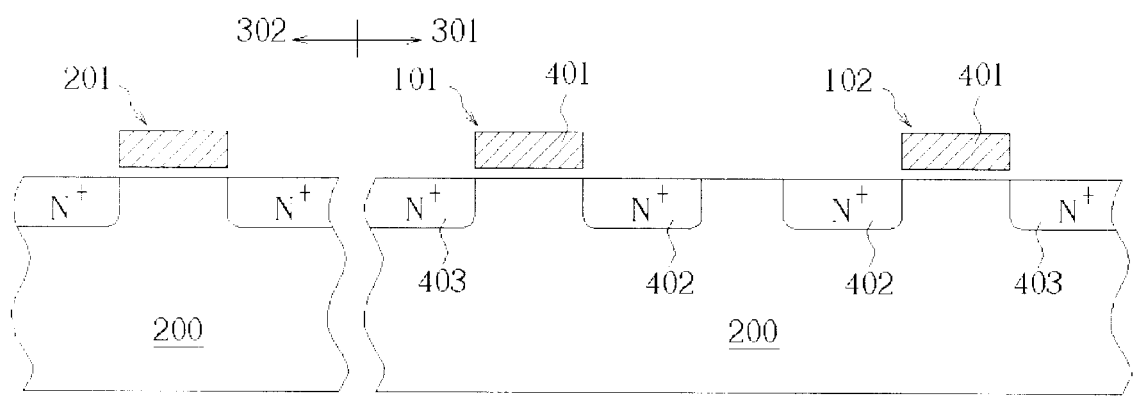
FIG. 2 to FIG. 8 are schematic cross-sectional diagrams illustrating the first preferred embodiment according to the present invention.
Figure 3:
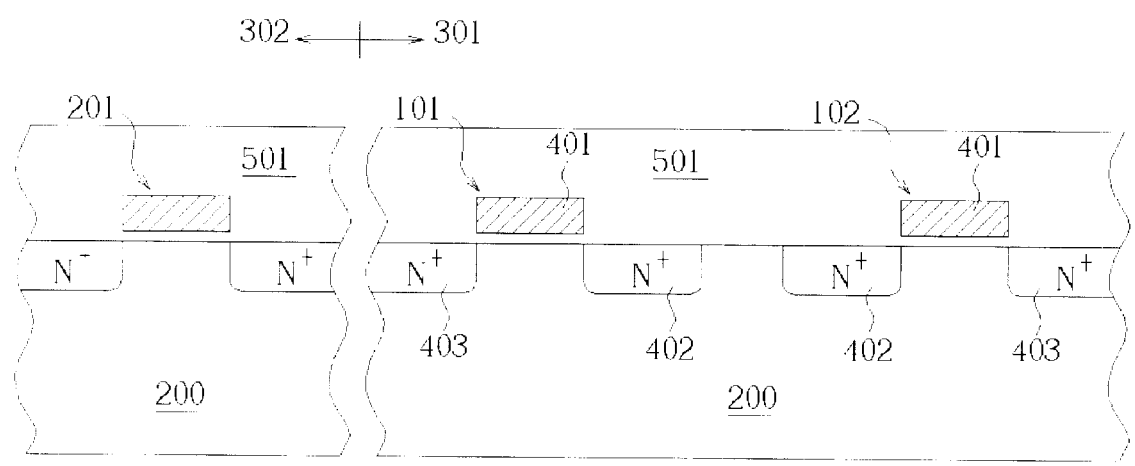

With reference to FIG. 2 to FIG. 8, a first preferred embodiment according to the present invention is illustrated in cross-sectional views. As shown in FIG. 2, a semiconductor substrate 200 is provided having a main surface on which a plurality of MOS transistors 101, 102, and 201 are formed. The main surface of the semiconductor substrate 200 is basically divided into two sections: the ROM section 301 and the peripheral section 302. An array of memory cells is formed within the ROM section 301, and only cells 101 and 102 are shown. The MOS transistor 201, which may be an active device of the peripheral circuit, is formed within the peripheral section 302. Each MOS transistor within the ROM section 301 has a gate 401, a drain 402, and a source 403. The gates 401 are parts of word lines or X address lines. The sources 403 are electrically connected to the source lines (not shown) that are grounded or biased to Vss. As shown in FIG. 3, a dielectric layer 501 such as an LPCVD silicon oxide layer or a BPSG layer is deposited overlying the ROM section 301 and the peripheral section 302. Preferably, the dielectric layer 501 has a thickness of between 2000 and 7000 angstroms.

Figure 4:
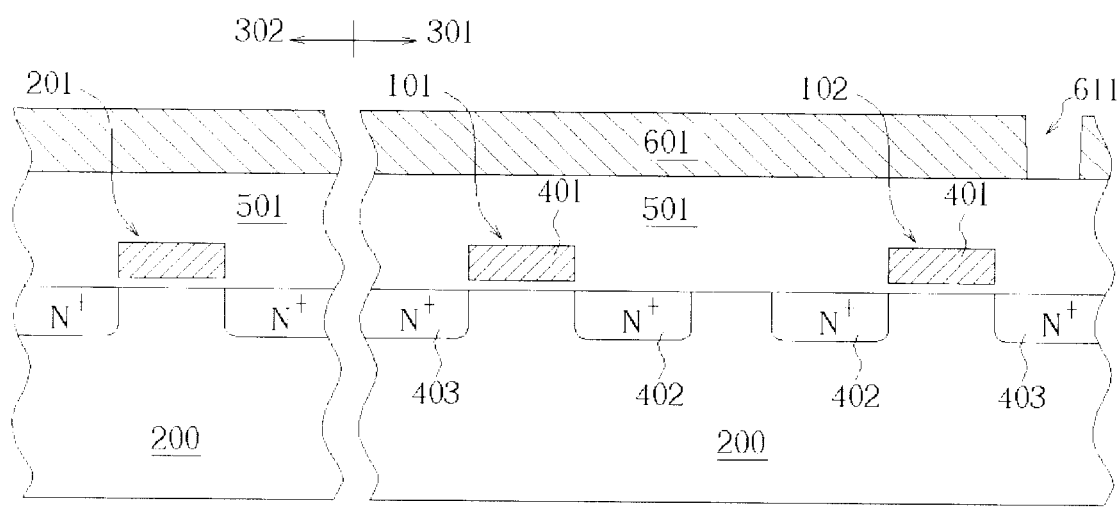
Figure 9:
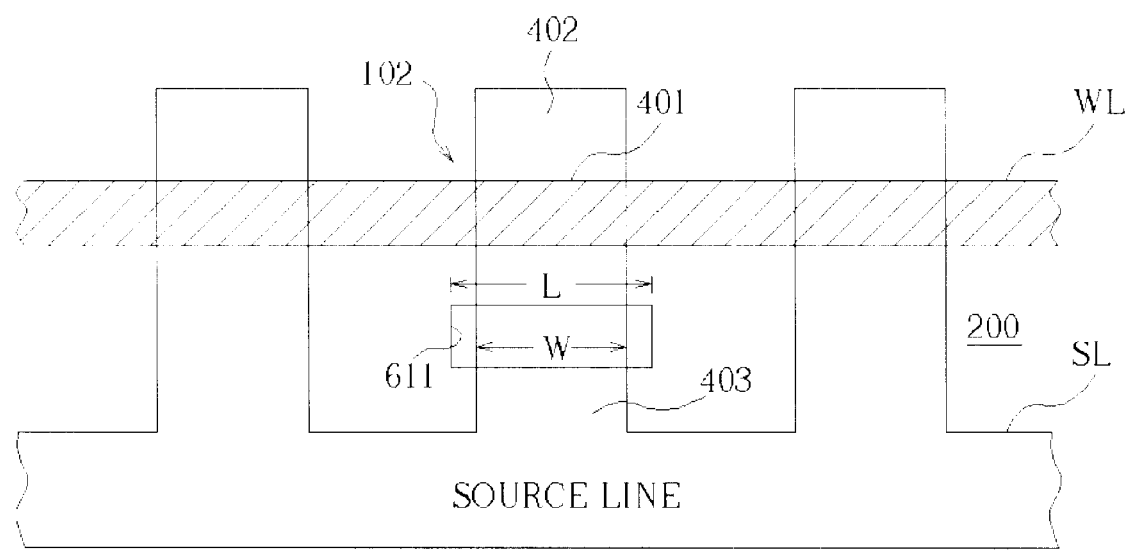
FIG. 9 is an enlarged top view of the cell to be coded and the window thereof as set forth in FIG. 4.

As shown in FIG. 4, a coding photoresist layer 601 is coated on the dielectric layer 501. The coding photoresist layer 601 is exposed to ultraviolet (UV) light through a photo mask that defines the customer ROM code. After development, the unexposed coding photoresist layer 601 is removed leaving a plurality of apertures defining exposure windows where the underlying memory cells within the ROM section 301 are to be coded permanently to an "OFF" state. In this case, the cell 102 is chosen, by way of example, as the transistor to be coded to an "OFF" state and only one window 611 is illustrated. It is noted that, at this phase, the peripheral section 301 is still masked by the coding photoresist layer 601. Referring to FIG. 9, a planar view showing the cell 102 and window 611 of FIG. 4 is illustrated. The length L of the window 611 must be greater than the width W of the source 403 of the transistor 102 to be coded.

Figure 5:
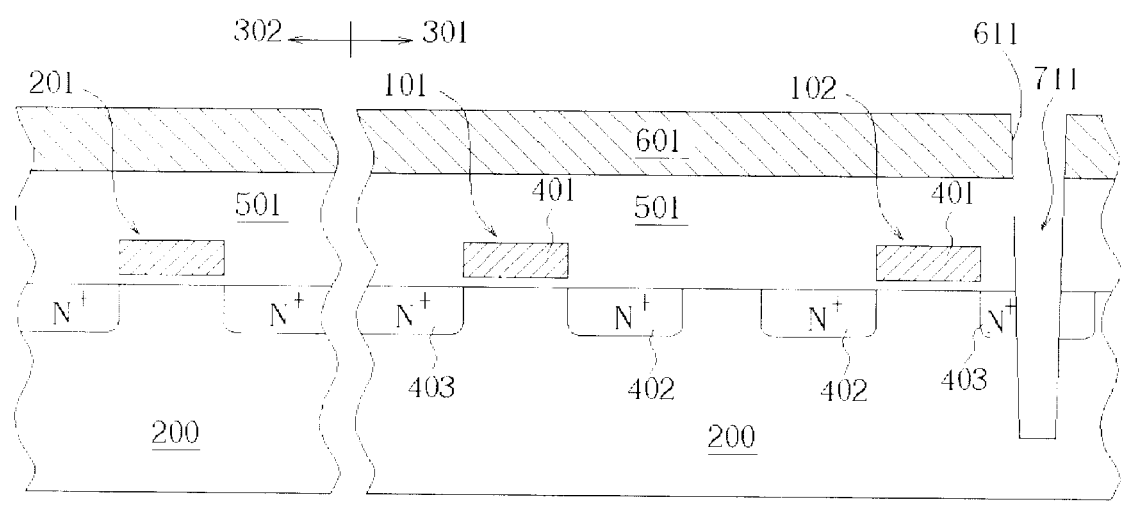
Figure 6:
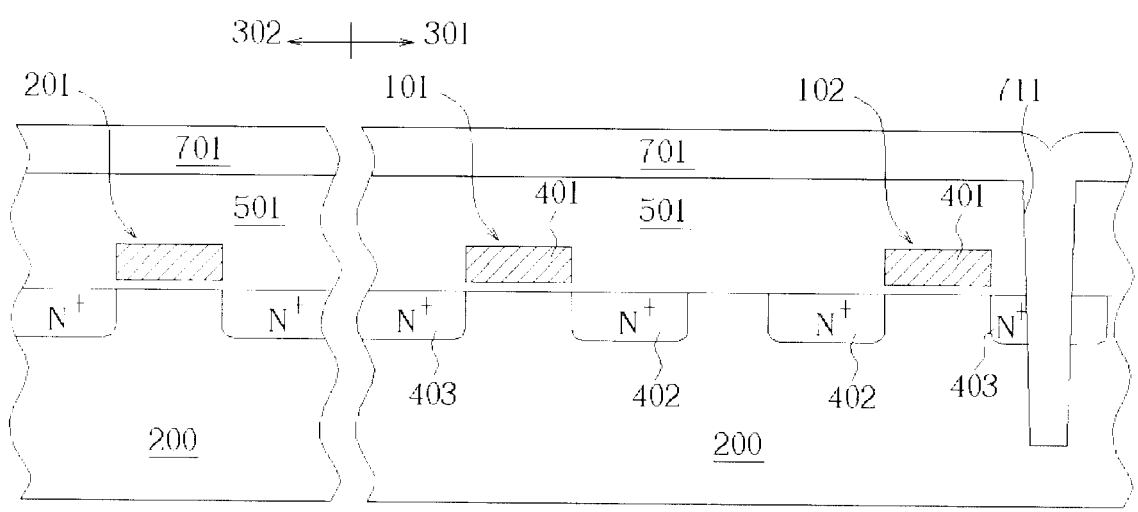

As shown in FIG. 5, using the coding photoresist layer 601 as a etching mask, an etching back process is carried out to etch the dielectric layer 501, the source 403 of the transistor 102, and a portion of the substrate 200 underneath the source 403 of the transistor 102 through the window 611 to a depth that is lower than the junction depth of the source of the transistor 102, so as to form a deep trench 711. That is, the depth of the deep trench 711 is larger than the combination of the thickness of the dielectric layer 501 and the junction depth of the source 403 of the transistor 102 for storing logic data "1". By doing this, the source 403 of the transistor 102 for storing logic data "1" is disconnected from the source line. As shown in FIG. 6, after stripping the coding photoresist layer 601, a gap fill layer 701 is deposited over the dielectric layer 501 to fill the deep trench 711.

Figure 7:
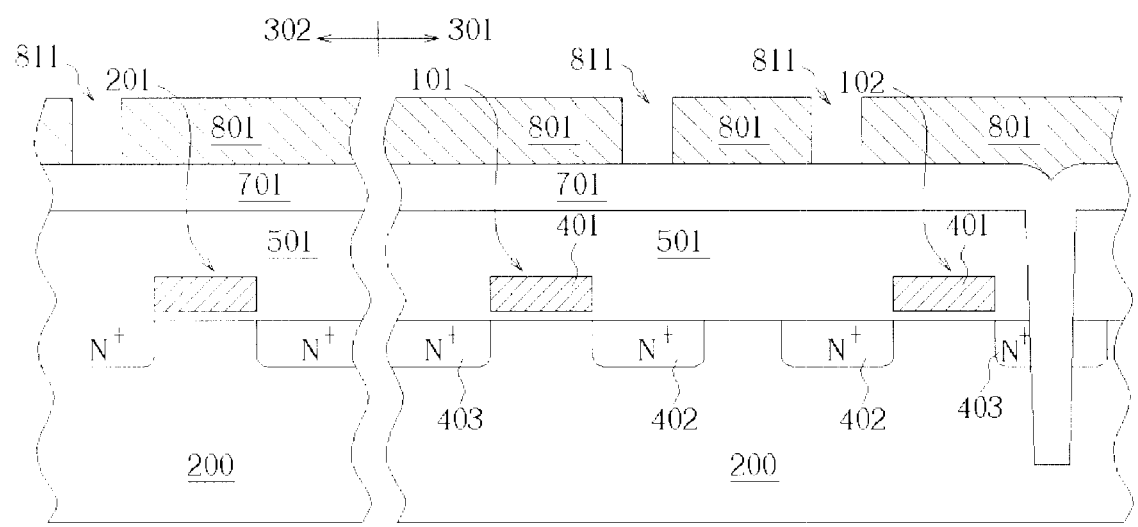
Figure 8:
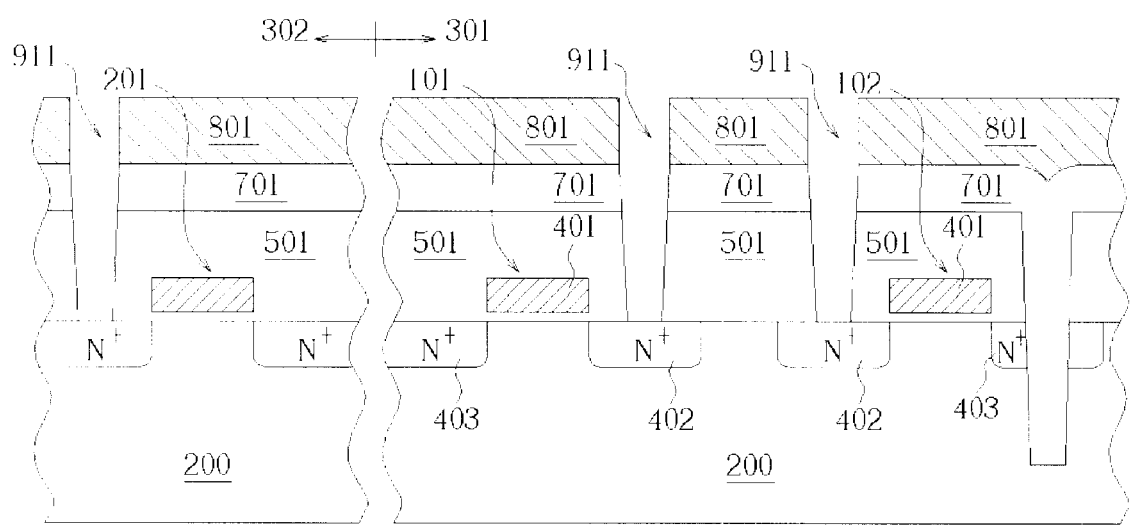

As shown in FIG. 7, in accordance with the first preferred embodiment of the present invention, after coding the ROM section 301, metallization is carried out. A photoresist layer 801 is coated on the gap fill layer 701 and patterned to form openings 811 that define the location of contact holes within the ROM section 301 and the peripheral section 302. An etching process is then implemented to etch the gap fill layer 701 and the dielectric layer 501 to expose portions of the underlying drains 402 through the openings 811 to form contact holes 911. The following metallization processes including contact plug formation and metal line patterning are known in the art and are thus omitted.

Figure 10:
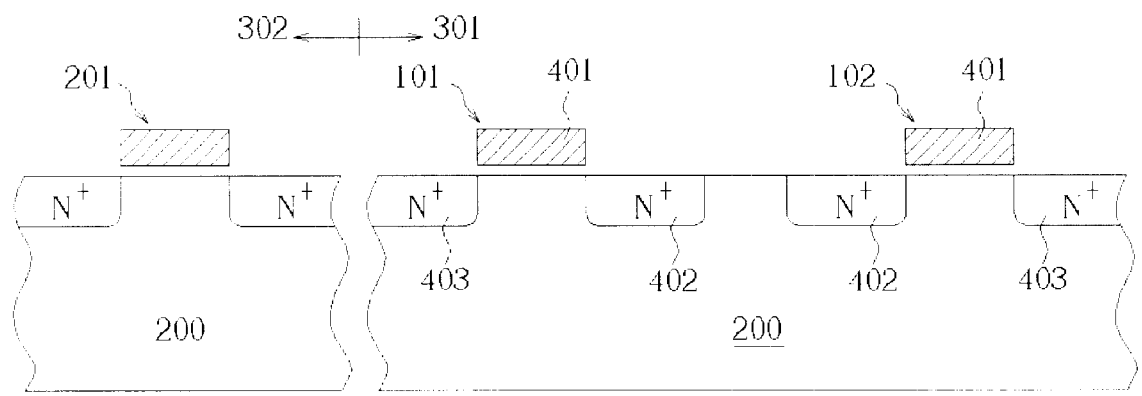
FIG. 10 to FIG. 15 are schematic cross-sectional diagrams illustrating the second preferred embodiment according to the present invention.

With reference to FIG. 10 to FIG. 15, a second preferred embodiment according to the present invention is illustrated in cross-sectional views in which like reference numerals designate similar or corresponding elements, regions, and portions. As shown in FIG. 10, a semiconductor substrate 200 is provided having a main surface on which a plurality of MOS transistors 101, 102, and 201 are formed. Likewise, the main surface of the semiconductor substrate 200 is basically divided into two sections: the ROM section 301 and the peripheral section 302. An array of memory cells is formed within the ROM section 301, and only cells 101 and 102 are shown. The. MOS transistor 201, which may be an active device of the peripheral circuit, is formed within the peripheral section 302. Each MOS transistor within the ROM section 301 has a gate 401, a drain 402, and a source 403. The gates 401 are parts of word lines or X address lines. The sources 403 are electrically connected to the source lines (not shown) that are grounded or biased to Vss.

Figure 11:
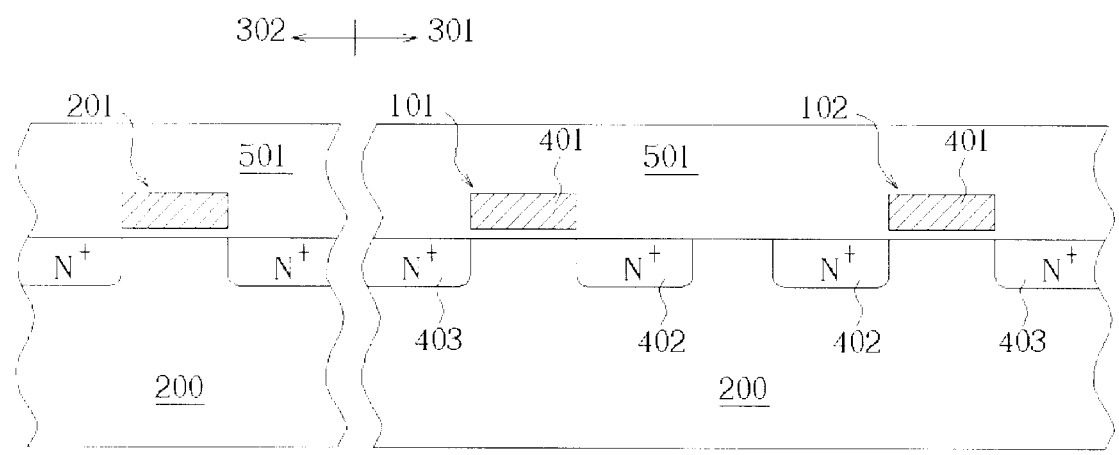

As shown in FIG. 11, a dielectric layer 501 such as an LPCVD silicon oxide layer or a BPSG layer is deposited overlying the ROM section 301 and the peripheral section 302. Preferably, the dielectric layer 501 has a thickness of between 2000 and 7000 angstroms.

Figure 12:
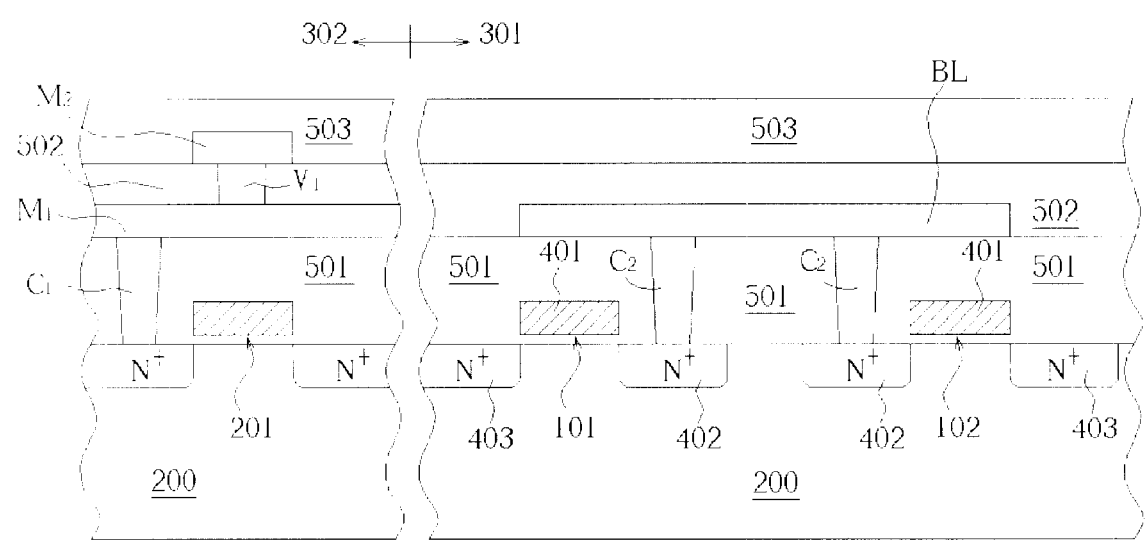
Figure 13:
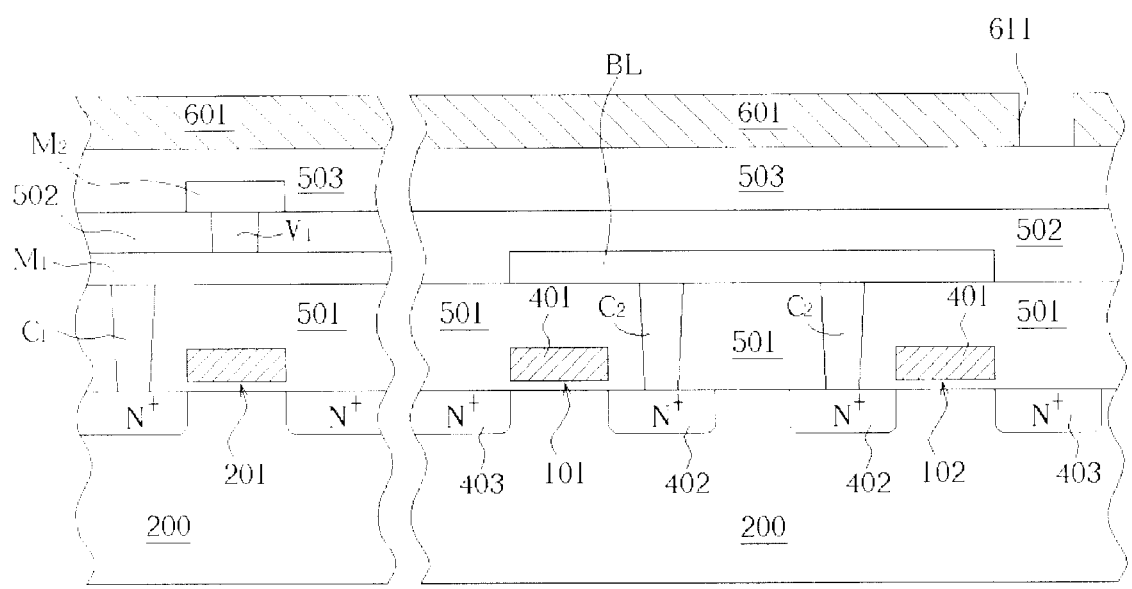
Figure 16:
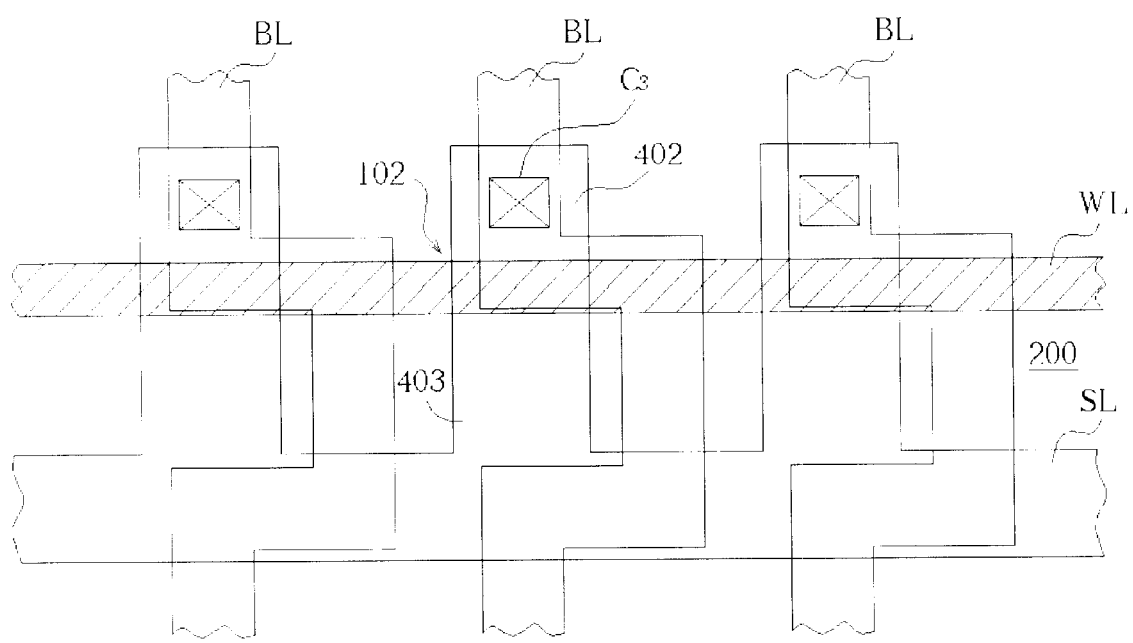
FIG. 16 is an enlarged top view depicting the special bit line pattern within the ROM section of FIG. 12.

As shown in FIG. 12, metallization is carried out. Within the peripheral section 302, multi-level metal lines and connecting contacts or vias are formed. As indicated, a contact $C_1$ is formed in the dielectric layer 501 to connect the source or drain of the transistor 201 with the first level metal $M_1$. The first level of metal within the ROM section 301 is patterned to form a bit line BL overlying the dielectric layer 501. The bit line BL is electrically connected to the drains 402 of the underlying MOS transistors 101 and 102 through the contact $C_2$ formed in the dielectric layer 501. Referring to FIG. 16, a top view depicting the special bit line pattern within the ROM section 301 of FIG. 12 is illustrated. The bit lines basically overlie the word line in an orthogonal manner, but bypass the underlying source regions 403 to not overlap the source regions 403. After forming the first level metal lines, a second level metal line $M_2$ is defined within the peripheral section 302 over an inter-metal dielectric (IMD) layer 502. The second level metal line $M_2$ is electrically connected to the first level metal through the via $V_1$, which is formed in the IMD layer 502. The IMD layer 502 also covers the bit line BL within the ROM section 301. After finishing the metalization processes, a passivation layer 503 is deposited on the second level metal line $M_2$, and on the IMD layer 502 within the ROM section 301 and the peripheral section 302. After this, the semiconductor device is stored or "banked". The device is held awaiting the details of a custom's order, which will determine the exact configuration of the code implant.

Figure 14:
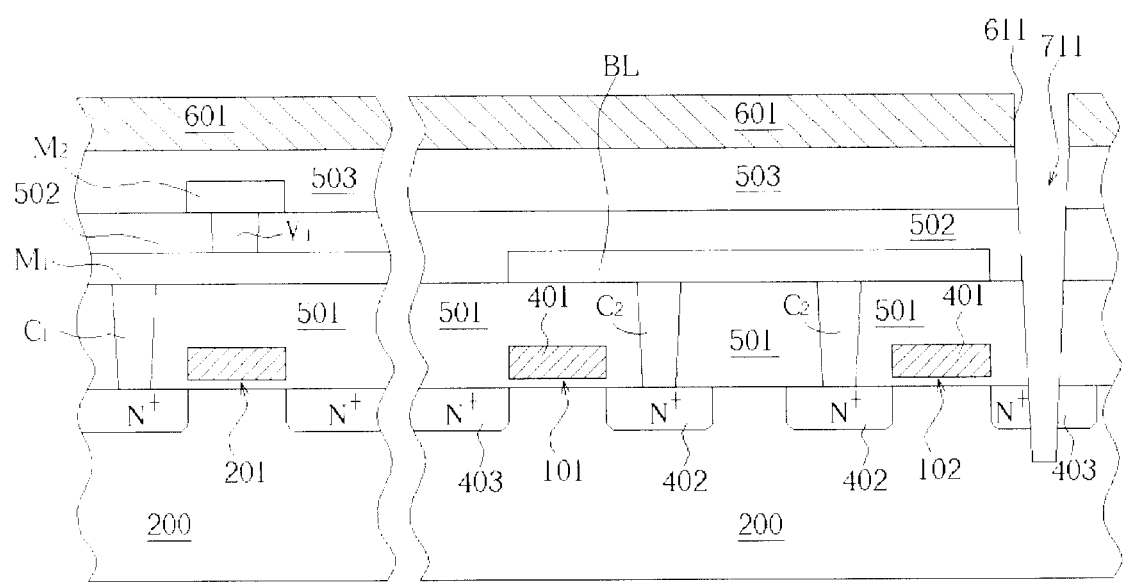
Figure 17:
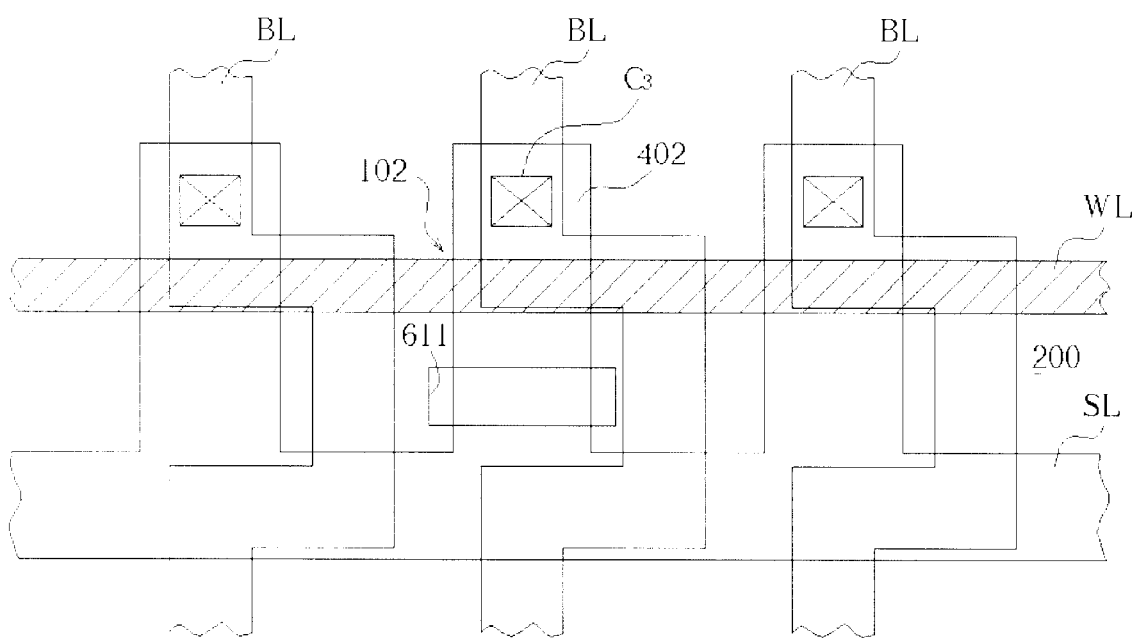
FIG. 17 is an enlarged top view of the cell to be coded and the window thereof as set forth in FIG. 13.

As shown in FIG. 14, a coding photoresist layer 601 is coated on the dielectric layer 501. The coding photoresist layer 601 is exposed to ultraviolet (UV) light through a photo mask that defines the customer ROM code. After development, the unexposed coding photoresist layer 601 is removed leaving a plurality of apertures defining exposure windows where the underlying memory cells or transistors within the ROM section 301 are to be coded permanently to an "OFF" state. In this case, the cell 102 is chosen, by way of example, as the transistor to be coded to an "OFF" state and only one window 611 is illustrated. Referring to FIG. 17, a planar view showing the cell 102 and window 611 of FIG. 14 is illustrated.

Figure 15:
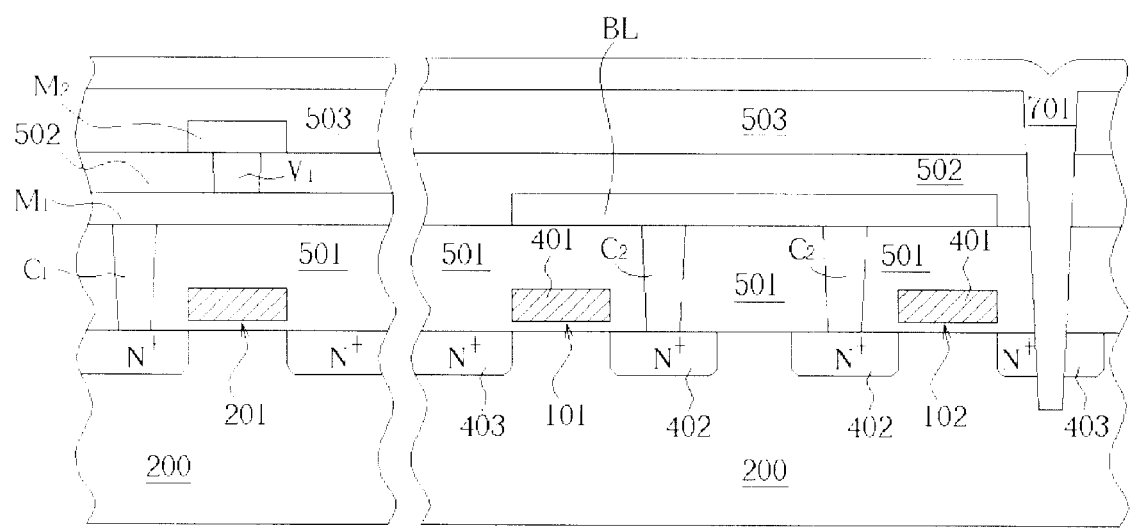

As shown in FIG. 14, using the coding photoresist layer 601 as a etching mask, an etching back process is carried out to etch the passivation layer 503, the IMD layer 502, the dielectric layer 501, the source 403 of the transistor 102, and a portion of the substrate 200 underneath the source 403 of the transistor 102 through the window 611 to a depth that is lower than the junction depth of the source 403 of the transistor 102 to form a deep trench 711. The depth of the deep trench 711 is larger than the combination of the thickness of the passivation layer 503, the IMD layer 502, the dielectric layer 501 and the junction depth of the source 403 of the transistor 102 for storing logic data "1". By doing this, the source 403 of the transistor 102 for storing logic data "1" is disconnected from the source line. As shown in FIG. 15, after stripping the coding photoresist layer 601, a gap fill layer 701 is deposited over the passivation layer 503 to fill the deep trench 711. As mentioned, customers require the product turn-around time between reception of the ROM code for a custom order and delivery of finished parts to be kept as short as possible. Less time for completion means a shorter product turn-around time. Coding after metallization can minimize the product turn-around time.

Those skilled in the art will readily observe that numerous modification and alterations of the present invention method may be made while retaining the teachings of the invention accordingly, the above disclosure should be constructed as limited only by the metes and bounds of the appended claims.

What is claimed is:

1. A method for manufacturing a read only memory (ROM) device capable of shortening product turn-around time, the method comprising the steps of:

providing a semiconductor substrate having thereon an array of metal-oxide-semiconductor field-effect transistors (MOSFETs) within a ROM region and a dielectric layer covering the MOSFETs within the ROM region, wherein each of the MOSFETs has a gate, a source, and a drain, and wherein all of the MOSFETs are initially in an "ON" state;

forming a coding photoresist layer on the dielectric layer; patterning the coding photoresist layer to form a plurality of apertures defining exposure windows where the underlying MOSFETs are to be coded from the "ON" state into an "OFF" state, wherein the exposure windows are disposed above the sources of the MOSFETs to be coded; using the patterning coding photoresist layer as an etching hard mask to etch the dielectric layer, the sources of the MOSFETs to be coded, and a portion of the semiconductor substrate underneath the sources of the MOSFETs to be coded through the exposure windows to a depth that is lower than a junction depth of the sources of the MOSFETs to be coded to form a deep trench, which disconnects the sources of the MOSFETs to be coded from source lines;

stripping the coding photoresist layer; and depositing a gap fill layer over the dielectric layer to fill the deep trench.

2. The method of claim 1 wherein each exposure window has a window length that is greater than a width of the source.

3. The method of claim 1 wherein the dielectric layer has a thickness of between 2000 and 7000 angstroms.

4. The method of claim 1 wherein after depositing a gap fill layer over the dielectric layer, the method further comprises:

forming contacts in the gap fill layer and the dielectric layer; and forming bit lines over the gap fill layer within the ROM region.

5. A method for manufacturing a read only memory (ROM) device capable of shortening product turn-around time, the method comprising:

providing a semiconductor substrate having thereon an array of field-effect transistors within a ROM region and a first dielectric layer covering the array of field-effect transistors, wherein each of the MOSFETs has a gate, a drain, and a source connected to a source line, and wherein all of the field-effect transistors are initially in an "ON" state;

forming bit lines on the first dielectric layer within the ROM region, wherein the bit lines are covered by a second dielectric layer, and wherein the bit lines bypass the underlying sources of the array of the field-effect transistors to not overlap with the sources;

forming a coding photoresist layer on the second dielectric layer;

patterning the coding photoresist layer to form a plurality of apertures defining exposure windows where the underlying field-effect transistors are to be coded permanently to an "OFF" state;

implementing a code etching back process, using the patterned coding photoresist layer as an etching hard mask to etch the second dielectric layer, the first dielectric layer, the sources of the MOSFETs to be coded, and a portion of the semiconductor substrate underneath the sources of the MOSFETs to be coded through the exposure windows to a depth that is lower than a junction depth of the sources of the MOSFETs to be codedto form a deep trench that disconnects the sources of the MOSFETs to be coded from the source lines; and stripping the coding photoresist layer.

6. The method of claim 5 wherein after stripping the coding photoresist layer, the method further comprises: depositing a gap fill layer over the second dielectric layer to fill the deep trench.

7. The method of claim 5 wherein a passivation layer is formed on the second dielectric layer.

8. The method of claim 5 wherein each exposure window has a window length that is greater than a width of the source.

* * * * *